United States Patent [19]

Nakamura et al.

[11] Patent Number: 4,945,204
[45] Date of Patent: Jul. 31, 1990

[54] METHOD OF LASER-MARKING SEMICONDUCTOR DEVICES

[75] Inventors: Masakatsu Nakamura; Sayuki Hieda, both of Itami, Japan

[73] Assignee: Mitsubishi Denki Kabushiki Kaisha, Japan

[21] Appl. No.: 426,453

[22] Filed: Oct. 19, 1989

Related U.S. Application Data

[63] Continuation of Ser. No. 301,064, Jan. 25, 1989, abandoned.

[30] Foreign Application Priority Data

Nov. 10, 1988 [JP] Japan .................. 63-282339

[51] Int. Cl.$^5$ .............................................. B23K 26/00
[52] U.S. Cl. ..................... 219/121.69; 219/121.75
[58] Field of Search ............. 219/121.68, 121.69, 219/121.73, 121.74, 121.75, 121.78; 346/76 L

[56] References Cited

U.S. PATENT DOCUMENTS

| | | | |
|---|---|---|---|
| 4,081,654 | 3/1978 | Mracek | 219/121.68 |
| 4,128,752 | 12/1978 | Gravel | 219/121.68 |
| 4,370,542 | 1/1983 | Mills et al. | 219/121.69 X |
| 4,405,852 | 9/1983 | Bononi | 219/121.69 |
| 4,626,656 | 12/1986 | Ootsuka et al. | 219/121.68 |

FOREIGN PATENT DOCUMENTS

| | | | |
|---|---|---|---|
| 0097787 | 6/1984 | Japan | 219/121.69 |
| 62-34691 | 2/1987 | Japan . | |
| 63-80990 | 4/1988 | Japan . | |

OTHER PUBLICATIONS

Electronic Packing Technology, vol. 2, No. 2, Feb. 1986.

*Primary Examiner*—C. L. Albritton
*Attorney, Agent, or Firm*—Leydig, Voit & Mayer

[57] ABSTRACT

The surface of the resin on a semiconductor device is subjected to a marking by a pulsed laser having an energy density of 3 to 60 J/cm$^2$ and a pulse width of 0.1 ms or less. By applying the laser beam to the surface a resin encapsulation, the resin can be instantaneously burnt and vaporized, as a result of which, the quantity of the cinders from burning of the resin at the time of the laser-marking is reduced.

3 Claims, 1 Drawing Sheet

METHOD OF LASER-MARKING SEMICONDUCTOR DEVICES

This application is a continuation of application Ser. No. 07/301,064, filed Jan. 25, 1989 now abandoned.

BACKGROUND OF THE INVENTION

1. Industrial Field of the Invention

The present invention relates to a method of laser-marking semiconductor devices, and, more particularly, to a method of marking the resin surface of a resin sealed type of semiconductor devices by a YAG laser.

2. Prior Art

FIG. 1 is a schematic structural view of a conventional YAG laser-marking device for use in a marking method. Referring to this drawing, laser beam 2, for example, pulsed laser beam, is generated by a laser beam generating device 1. The thus-generated laser beam 2 is introduced, by means of mirrors 3, to a laser beam rectifying portion 4 wherein the beam is rectified and made substantially the same size as that of a mask 5. Mask 5 has a surface thereof engraved with a mark such as characters. The thus-rectified laser beam 2 takes the shape of this character or the like by being passed through this mask 5. The laser beam 2 is applied to the surface of a resin, for example, an epoxy resin, which seals a semiconductor device 8 so that the surface of the resin is engraved with the mark.

The conventional laser marking method is performed as described above wherein the pulse width of the laser beam 2 is 0.2 to several ms (millisecond), the energy density is 3 to 60 J/cm$^2$, and the diameter of the beam is several mm to ten and several mm. These laser conditions are values for the semiconductor devices.

In the above described type of laser-marking method, the amount of cinders generating by burning the sealing resin on the semiconductor device with the engraving laser beam is too large. Therefore, the engraved character can be clearly seen due to the above-described cinders. A problem is caused since cinders needs to be removed, such as by wiping the resin cinders with a cloth wetted with alcohol.

SUMMARY OF THE INVENTION

To this end, an object of the present invention is to provide a laser-marking method capable of overcoming the above-described problems and reducing the amount of the cinders generated from burning the resin of the semiconductor device by laser-marking and thereby omitting the removal operation such as wiping off the resin cinders after laser beam has been applied.

According to the present invention, there is provided a method of laser-marking semiconductor devices in which a laser beam generating device generate a laser beam, the thus-generated laser beam is rectified to become substantially the same size as that of a masken graved with a mark such as a character or the like, the thus rectified laser beam is passed through the mask so as to take the shape of the mark, and then the laser beam is applied to the surface of a resin on the semiconductor device so that the same is engraved with the mark, the laser-marking method comprises:

applying a laser beam having an energy density of 3 to 60 J/cm, and a pulse width of 0.1 milliseconds or less to the surface of the resin;

DESCRIPTION OF THE PREFERRED EMBODIMENT

Figure 1:
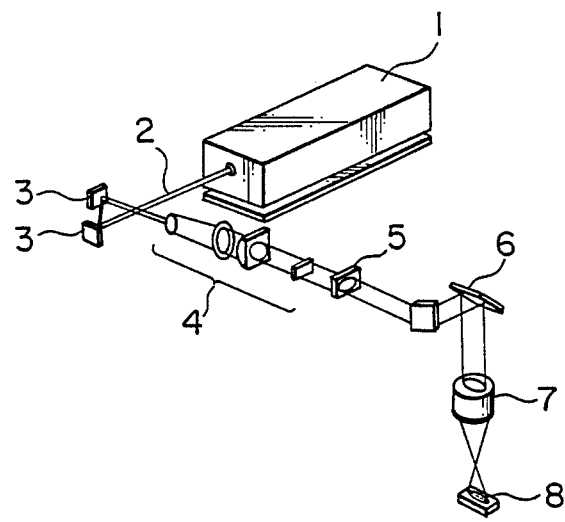
FIG. 1 is a structural view schematically illustrating a laser-marking method device used in an embodiment of the present invention and also used in a conventional method of laser marking semiconductor devices.

FIG. 1 is a structural view schematically illustrating a YAG laser-marking device for use in a laser-marking method according to an embodiment of the present invention. It is completely the same as that used in a conventional method in which the laser-marking is, similarly to the conventional method, performed. Laser beam 2, for example, pulsed laser beam, is generated by a laser beam generating device 1. The thus-generated laser beam 2 is introduced to a laser beam rectifying portion 4 wherein the same is rectified and made substantially the same size as that of a mask 5 having the surface thereof engraved with a mark such as a character. The shape of the thus-rectified laser beam 2takes the shape of this character or the like by passing through this mask 5. The laser beam applied to the surface of a resin, for example, an epoxy resin, which seals a semiconductor device 8 so that the surface of the resin is engraved with the mark such as a character.

According to the present invention, the energy density of the laser beam applied to the surface of the resin sealing the semiconductor device is 3 to 60 J/cm$^2$, the pulse width is 0.1 ms or less, and the diameter of the beam is 0.5 to 5mm Since a laser beam as described above has a large energy per unit time so that the resin is heated, in a short time to a high temperature. Therefore, the resin can be instantaneously burnt and vaporized, causing cinders to be removed satisfactorily. Therefore, no resin cinders removal operation after the laser beam has been engraved to the resin as needed.

Figure 2:
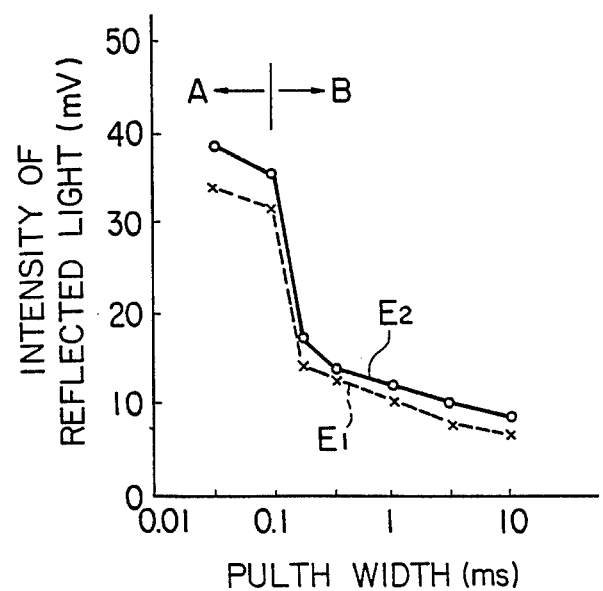
FIG. 2 is a graph illustrating the result of the appearance evaluation performed immediately after a laser beam is applied to a resin for sealing the semiconductor in accordance with the present invention and the conventional method.

Laser-marking of semiconductor sealing resin was performed according to the present invention and according to the conventional method for visually testing the marking character obtained. In this visual test an automatic character recognition device is used. The resin portion to which the laser beam is applied and another portion to which no laser beam is applied are respectively irradiated with light, and the difference of the intensity of the reflected light is obtained and expressed as a potential difference (mV). FIG. 2 is a graph illustrating the result of the visual test performed before wiping off the resin cinders, and immediately after the laser beam had been applied to the semiconductor device sealing resin. Referring to this graph, the abscissa represents the pulse width (ms) of the laser beam, while the ordinate represents the intensity (mV) of the reflected light which indicates the appearance as measured by the above-described automatic character recognizing device. Referring to this graph, symbol A represents the pulse width in the laser marking. method according to the present invention, while symbol B represents the pulse width according to the conventional method. Symbol $E_1$ represents the case where the energy density of the laser beam is 3 J/cm$^2$, while symbol $E_2$ represents the case where the energy density of the laser beam is 60 J/cm². The diameter of the applied laser beam was 1 mm.

As can be clearly seen from this graph, when the pulse width of the laser beam exceeds, in the conventional method, 0.2 ms, the appearance value (the intensity of the reflected light) becomes a very low level so that the character almost can not be seen. On the other hand, if the pulse width is 0.1 ms or less, the appearance value is high so that the character can be sufficiently seen. The reason for this result lies in the energy per unit time. That energy per unit time is low when the pulse width is 0.2 ms or more so that the temperature at which the resin of the semiconductor device is burnt is low. Therefore, the cinders of the burning of the resin become adhesive cinders and cover the character, making it impossible to see character. Meanwhile, in a case where the energy density of the laser beam is to be 3 to 60 J/cm² and the pulse width is 0.1 ms or less according to the present invention, the energy per unit time is sufficiently high so that the resin reaches, in a short time, a high temperature. Therefore, the resin can be instantaneously burnt and vaporized. As a result of this, the resin can be burnt without any residual cinders. Therefore, according to the present invention, compared to the conventional method, it becomes needless to wipe off the surface of the resin after the laser beam has been applied thereto. The character obtained from the marking can be clearly seen. Consequently, wiping off of the cinders after laser-marking is unnecessary.

What is claimed is:

1. A method of laser-marking semiconductor devices comprising rectifying a pulsed laser beam to substantially the same size as that of a mask engraved with a mark such as a character or the like, passing the laser beam through said mask so that the beam takes the shape of said mark, and applying said laser beam to a resin surface of a resin sealed semiconductor device to engrave the resin with said mark, wherein the energy density of said laser beam on the surface of said resin is 3 to 60 J/cm²;

the pulse width of said laser beam is 0.1 ms or less, whereby said marking is performed 2. A method of laser-marking semiconductor devices according to claim 1, wherein said resin comprises an epoxy resin.

3. The method of laser-marking semiconductor devices according to claim 1 wherein the diameter of the laser beam is 0.5 to 5 mm.

* * * * *